United States Patent
Fairchild et al.

(10) Patent No.: US 9,230,739 B2
(45) Date of Patent: Jan. 5, 2016

(54) PLZT CAPACITOR ON GLASS SUBSTRATE

(71) Applicants: DELPHI TECHNOLOGIES, INC., Troy, MI (US); UCHICAGO ARGONNE, LLC, OPERATOR OF ARGONNE NATIONAL LABORATORY, Argonne, IL (US)

(72) Inventors: M. Ray Fairchild, Kokomo, IN (US); Ralph S. Taylor, Novlesville, IN (US); Carl W. Berlin, West Layfette, IN (US); Celine W K Wong, Kokomo, IN (US); Beihai Ma, Naperville, MA (US); Uthamalingam Balachandran, Willowbrook, IL (US)

(73) Assignee: UChicago Argonne, LLC, Chicago, IL (US)

( * ) Notice: Subject to any disclaimer, the term of this patent is extended or adjusted under 35 U.S.C. 154(b) by 261 days.

(21) Appl. No.: 14/065,837

(22) Filed: Oct. 29, 2013

(65) Prior Publication Data

US 2015/0116894 A1    Apr. 30, 2015

(51) Int. Cl.
| | |
|---|---|
| *H01G 4/12* | (2006.01) |
| *H01G 4/30* | (2006.01) |
| *H01G 4/33* | (2006.01) |
| *H01G 4/38* | (2006.01) |
| *H01G 4/008* | (2006.01) |
| *H01L 49/02* | (2006.01) |

(52) U.S. Cl.
CPC .............. *H01G 4/1245* (2013.01); *H01G 4/30* (2013.01); *H01G 4/306* (2013.01); *H01G 4/33* (2013.01); *H01G 4/008* (2013.01); *H01G 4/38* (2013.01); *H01L 28/55* (2013.01)

(58) Field of Classification Search
CPC ........................................................ H01G 4/12
See application file for complete search history.

(56) References Cited

U.S. PATENT DOCUMENTS

| | | | |
|---|---|---|---|
| 2,449,952 A | 9/1948 | Pridham | |
| 3,615,757 A | 10/1971 | Herczog et al. | |
| 4,135,224 A | 1/1979 | Maher | |
| 6,088,216 A | 7/2000 | Laibowitz et al. | |
| 7,118,940 B1 | 10/2006 | Myers et al. | |
| 7,384,818 B2 | 6/2008 | Kim et al. | |
| 7,494,848 B2 | 2/2009 | Kim | |
| 8,063,982 B2 | 11/2011 | Kim et al. | |
| 8,647,737 B2 * | 2/2014 | Ma et al. ............... | H01B 19/04 361/321.1 |
| 2011/0085279 A1 | 4/2011 | Lanagan et al. | |
| 2011/0317329 A1 | 12/2011 | Letz et al. | |
| 2013/0335882 A1 * | 12/2013 | Ma et al. ............... | H01G 4/008 361/305 |

FOREIGN PATENT DOCUMENTS

| | | |
|---|---|---|
| EP | 2 458 603 A1 | 5/2012 |
| WO | 2012/096658 A1 | 7/2012 |

OTHER PUBLICATIONS

Partial European Search Report dated Feb. 26, 2015.
European Search Report dated Jul. 8, 2015.

* cited by examiner

*Primary Examiner* — Seahvosh Nikmanesh
(74) *Attorney, Agent, or Firm* — Lawrence D. Hazelton

(57) ABSTRACT

A lead-lanthanum-zirconium-titanate (PLZT) capacitor on a substrate formed of glass. The first metallization layer is deposited on a top side of the substrate to form a first electrode. The dielectric layer of PLZT is deposited over the first metallization layer. The second metallization layer deposited over the dielectric layer to form a second electrode. The glass substrate is advantageous as glass is compatible with an annealing process used to form the capacitor.

3 Claims, 2 Drawing Sheets

PLZT CAPACITOR ON GLASS SUBSTRATE

GOVERNMENT LICENSE RIGHTS STATEMENT

This is an invention jointly developed by Argonne National Lab and Delphi Automotive System, LLC. The United States Government has rights in this invention pursuant to Contract No. DE-AC02-06CH11357 between the United States Government and UChicago Argonne, LLC representing Argonne National Laboratory and pursuant to Contract No. DE-FC26-07NT43121 between the United States Government/Department of Energy and Delphi Automotive Systems, LLC.

TECHNICAL FIELD OF INVENTION

This disclosure generally relates to capacitors, and more particularly relates to a capacitor that uses lead-lanthanum-zirconium-titanate (PLZT) as a dielectric layer and glass as a substrate to form the capacitor.

BACKGROUND OF INVENTION

Lead-lanthanum-zirconium-titanate (PLZT) is a ceramic material that has been found to be useful as a capacitor dielectric as PLZT has a high dielectric constant and is capable of relatively high temperature operation, operation up to 150° C. for example. However, PLZT requires a substrate that is very smooth and can endure the 650° C. temperature for annealing PLZT. Prior attempts at forming a PLZT capacitor used polished nickel (Ni) foil, or a platinum (Pt) coated silicon wafer as a substrate for the capacitor. However, Ni foil requires polishing and oxidizes quickly, so an oxygen free working environment is required. Furthermore, a buffer layer of lanthanum-nickel-oxide (LNO) is needed to prevent diffusion between the Ni and the PLZT material. All of these issues make Ni foil a complicated and undesirably expensive substrate material choice. A Pt coated silicon wafer is rigid, so a capacitor formed on this substrate cannot be bent or rolled to meet certain packaging requirements. Furthermore, like Ni foil, a Pt coated silicon wafer is also undesirably expensive.

SUMMARY OF THE INVENTION

In accordance with one embodiment, a capacitor is provided. The capacitor includes a substrate, a first metallization, a dielectric layer, and a second metallization. The substrate is formed of glass. The first metallization layer is deposited on a top side of the substrate to form a first electrode. The dielectric layer is formed of lead-lanthanum-zirconium-titanate (PLZT) and is deposited over the first metallization layer. The second metallization layer deposited over the dielectric layer to form a second electrode.

In another embodiment, a method of forming a capacitor is provided. The method includes the step of providing a substrate formed of glass. The method also includes the step of depositing a first electrode on top of the substrate by electron-beam evaporation. The method also includes the step of depositing a dielectric layer formed of lead-lanthanum-zirconium-titanate (PLZT) deposited on top of the first electrode using a sol-gel process. The method also includes the step of depositing a second electrode on top of the dielectric layer by electron-beam evaporation.

Further features and advantages will appear more clearly on a reading of the following detailed description of the preferred embodiment, which is given by way of non-limiting example only and with reference to the accompanying drawings.

BRIEF DESCRIPTION OF DRAWINGS

The present invention will now be described, by way of example with reference to the accompanying drawings, in which.

DETAILED DESCRIPTION

Figure 1:
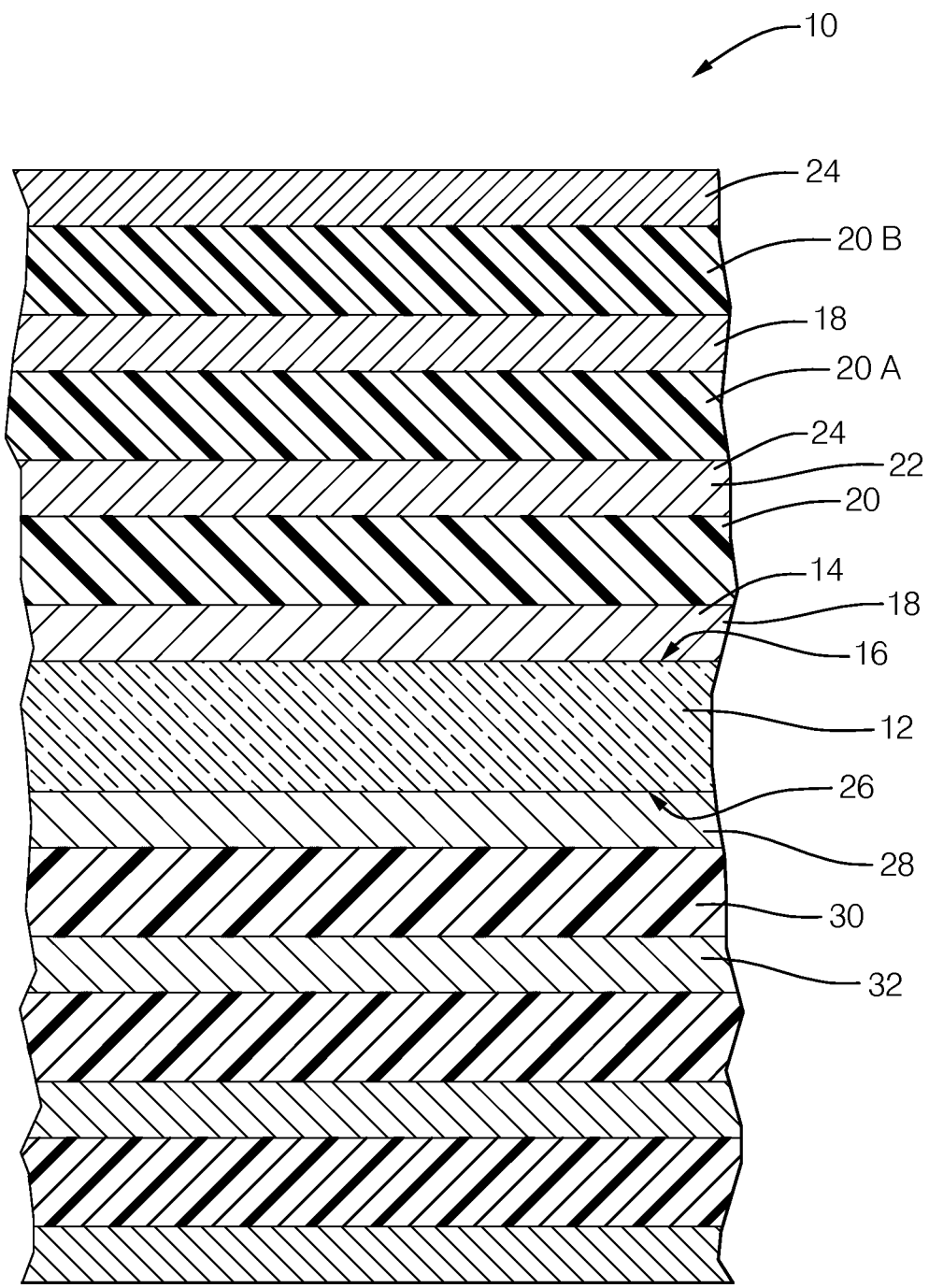
FIG. 1 is a sectional view of a lead-lanthanum-zirconium-titanate (PLZT) capacitor in accordance with one embodiment.

FIG. 1 illustrates a non-limiting example of the various layers described herein to form a capacitor 10. The relative thickness of the layers illustrated is not meant to infer anything regarding the relative thickness of the actual layers of materials used to form the capacitor 10, but are only shows as different thicknesses to make it easier to visualize the description presented below.

The capacitor is generally formed or built upon a substrate 12 formed of glass. As used herein, glass is an amorphous (non-crystalline) solid material that exhibits a glass transition, which is the reversible transition in amorphous materials (or in amorphous regions within semi-crystalline materials) from what is often considered a hard and relatively brittle state into a molten or rubber-like state. However, as will be described in more detail below, recent developments in manufacturing thin layers of glass have shown that thin layers can be somewhat flexible. In general, the glass used for the substrate 12 is soda-lime glass, composed of about 75% silica (SiO2) plus sodium oxide (Na2O) from soda ash, lime (CaO), and potentially several minor additives. As such the basic materials used for the substrate 12 are comparable to the materials used to make the familiar type of glass used for centuries in windows and drinking vessels. However, relatively recent developments in glass making for flat-panel display glass and the like provide glass that is smooth enough for use as the substrate 12.

In one embodiment, the substrate 12 may be formed of an ultra-thin sheet of Willow Glass available from Corning Inc. located in Corning, N.Y., USA, and elsewhere. Glass with a thickness of one-hundred micrometer (100 um) or less is generally classified as ultra-thin glass. Suitable ultra-thin glass is also available from Nippon Electric Glass America.

Preferably, the glass has a surface roughness (Ra) less than three nanometers (3 nm). A typical dielectric thickness for a lead-lanthanum-zirconium-titanate (PLZT) is 0.15 um per layer, so the surface roughness of the substrate may be a concern. Prior attempts to make a PLZT capacitor on substrates other than glass often required an expensive polishing of the metal layer to which PLZT was applied. 3 nm was selected as the upper limit for instances where nickel foil formed the metal layer to which PLZT was applied. However, it has been observed that glass is generally much smoother. Samples of glass obtained from Nippon have been measured at 0.45 nm of roughness. As such, using glass as a substrate is particularly advantageous as doing so avoids special polishing operations.

Preferably, the glass has a relatively low concentration of ionic sodium (Na), less than ten parts-per-million (10 ppm) for example. A low concentration of ions such as ionic Na and/or ionic potassium (K) is preferable as the presence of such ions in relatively high concentrations may cause the substrate 12 to be electrically conductive, i.e. less of an electrical insulator, and therefore less desirable if the various layers described below are built on both sides of the substrate 12. As such, some commercially available glass that is used for windows may not be suitable to form the substrate. While not subscribing to any particular theory, if ionic contamination or concentration is too high, it is believed that the ions can move or migrate in the presence of an electrical field or bias which may lead to undesirable electrical isolation or leakage issues.

While any thickness of the substrate 12 may be used, it may be advantageous to form the substrate from glass that has a thickness less than one-hundred micrometers (100 um). Such an ultra-thin glass may be advantageous if the capacitor 10 is to be shaped or bent to some shape other than flat. By way of example and not limitation, the capacitor 10 may initially be in a sheet form fabricated using a roll-to-roll process, and then the sheet may be rolled into a tube shape so that the capacitor 10 may be packed in a tubular can-type package similar to that commonly used for aluminum-electrolytic type capacitors.

The capacitor 10 includes a first metallization layer 14 that is generally deposited on or over a top side 16 of the substrate 12 to form a first electrode 18. As used herein, the term 'top side' is merely a relative term, and could just as well be 'first side'. By way of example and not limitation, the first metallization layer 14 may be deposited using the known electron-beam evaporation process. Prototypes of the capacitor 10 have been made using a two-hundred nanometer (200 nm) layer of platinum (Pt) on the surface of ultra-thin flexible glass obtained from Nippon Electric Glass America to form the first electrode 18. Alternatively, the first electrode 18 may be formed of nickel, copper, or aluminum. Other features of the first electrode 18 that are contemplated, but not illustrated, include contacts or terminations so other metallization layers may be interconnected to form a multilayer capacitor, and/or electrically connect the capacitor 10 to other circuitry, as will be recognized by those skilled in the capacitor fabrication arts.

The capacitor 10 includes a dielectric layer 20 formed of lead-lanthanum-zirconium-titanate (PLZT) deposited over the first metallization layer 14. The depositing of PLZT may include using a sol-gel process. The sol-gel process is a known chemical procedure where materials in solution, the 'sol', gradually evolve towards the formation of a gel-like substance. By way of example and not limitation, solutions of PLZT may be spun onto the first metallization layer 14 and processed at an elevated temperature (e.g. 650° C.) to create thin layers of PLZT approximately 0.1 um thick. Multiple layers are typically required to meet the voltage breakdown requirements of the capacitor 10. By way of further example, prototypes of the capacitor 10 used five layers of PLZT that were coated on the surface of the platinum that formed the first metallization layer 14 to form the dielectric layer 20.

When fabricating prototypes of the capacitor 10, precursor solutions of 0.5M concentration PLZT were prepared by a modified 2-methoxyethanol (2MOE) synthesis route using an appropriate amount of titanium isopropoxide, zirconium n-propoxide, lead acetate trihydrate, and lanthanum nitrate hexahydrate, all from Sigma-Aldrich. The resulting stock solution contained 20% excess lead to compensate for lead loss during the heat treatments described below.

Before being used for coating, the PLZT precursor solution was filtered through Restek polytetrfluoroethylene (PTFE) syringe filters with 0.22 µm open pore size, available from Restek Corp., Bellefonte, Pa. The filtered PLZT precursor solution was spin coated with a Laurell WS400 spin processor available from Laurell Technologies, North Wales, Pa. The spin processor was operated at 3000 revolutions-per-minute for 30 seconds on the platinum coated Nippon Electric Glass substrates, pyrolyzed at 450° C. for 5 minutes, and then annealed at 650° C. for 5-10 minutes for each coating. Those steps were repeated to build the PLZT film with desired thickness. Acceptable electrical properties were measured on samples with 5 layers of PLZT. Upon finishing all layers, additional annealing was performed at 650° C. for 15 minutes. All pyrolysis and annealing were performed in air filled Lindburg tube furnaces. Each coating resulted in a PLZT film of ≈0.115 µm thickness after pyrolysis and crystallization. Film thickness was determined from cross-sectional images with scanning electron microscopy (SEM).

The capacitor 10 includes a second metallization layer 22 deposited over the dielectric layer 20 to form a second electrode 24. The second metallization layer 22 may be the same material and thickness as the first metallization layer 14, for example a 200 nm thick layer of Pt. The first electrode 18, the dielectric layer 20, and the second electrode 24 cooperate to form the capacitor 10. As will be recognized by those skilled in the capacitor fabrication arts, addition metallization layers may be added to form more layers of the first electrode 18 and the second electrode 24, each metallization layer separated by additional dielectric layers 20A and 20B, for example, to form a multi-layer capacitor.

It may be advantageous to duplicate all the layers applied to the top side 16 on the bottom side 26 as doing so helps to balance stresses on opposite sides of the substrate 12. Accordingly, the capacitor 10 may include a third metallization layer deposited on a bottom side of the substrate to form a third electrode 28; a second dielectric layer 30 formed of lead-lanthanum-zirconium-titanate (PLZT) deposited over the third metallization layer; and a fourth metallization layer deposited over the second dielectric layer to form a fourth electrode 32. Additional layers of metal and dielectric may be added as necessary. Also, it is recognized that, for example, the first electrode 18 and the third electrode 28 could be electrically connected, and the second electrode 24 and the fourth electrode 32 could be connected.

Figure 2:
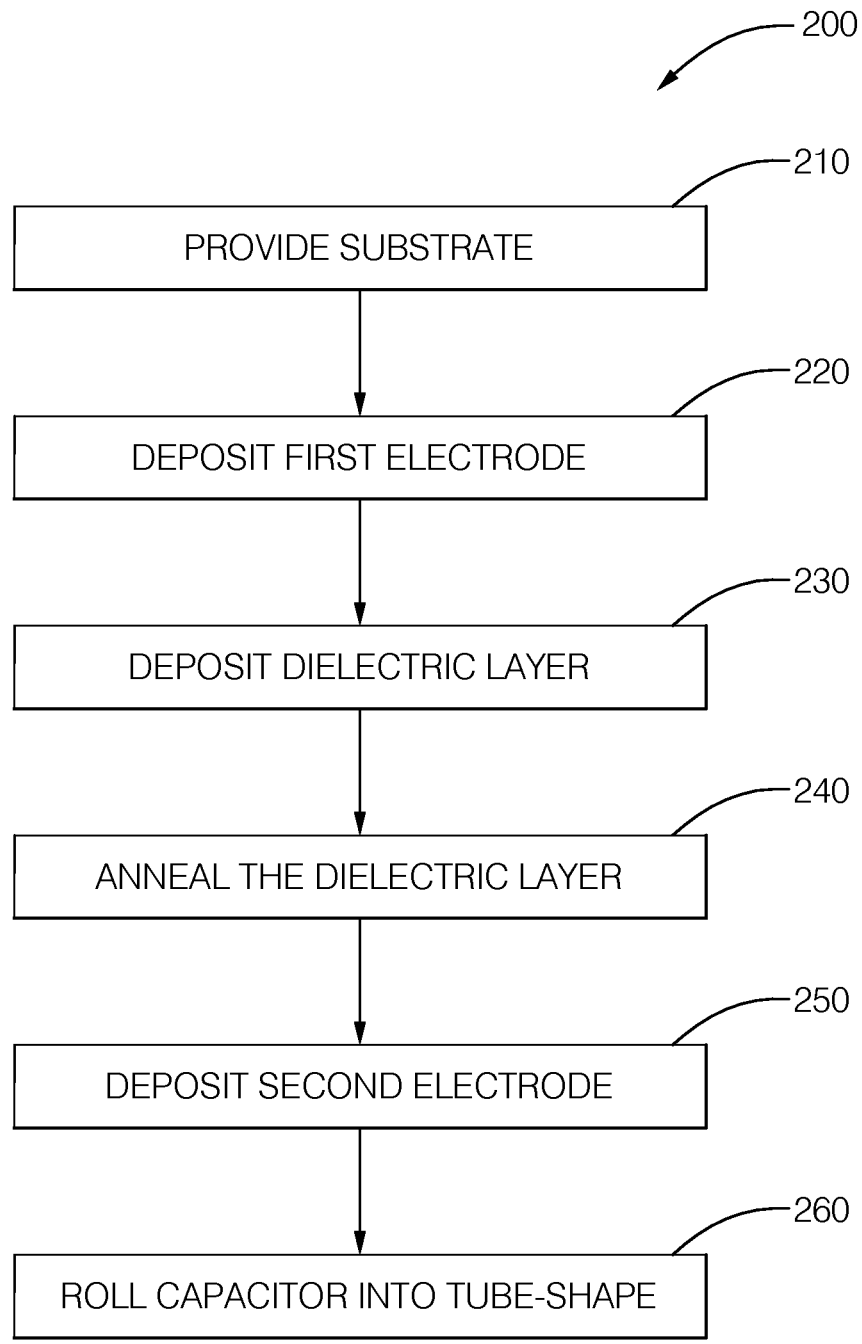
FIG. 2 is flowchart of a method of making the capacitor of FIG. 1 in accordance with one embodiment.

FIG. 2 illustrates a non-limiting example of a method 200 of forming a capacitor 10.

Step 210, PROVIDE SUBSTRATE, may include providing a substrate 12 formed of glass. By way of example and not limitation, the substrate 12 may be formed of an ultra-thin sheet of Willow Glass available from Corning Inc. located in Corning, N.Y., USA, and elsewhere. Glass with a thickness of one-hundred micrometer (100 um) or less is generally classified as ultra-thin glass, which has been observed to be relatively flexible compared to the expected flexibility of thicker glass. Suitable ultra-thin glass is also available from Nippon Electric Glass America. Forming the substrate of glass is particularly advantageous as glass easily survives the annealing process described below (Step 240), and is readily made smooth enough so polishing of electrode layers formed of metal can generally be avoided.

Step 220, DEPOSIT FIRST ELECTRODE, may include depositing a first electrode 18 on top of the substrate 12 by electron-beam evaporation. Details of process parameters for this step are provided above.

Step 230, DEPOSIT DIELECTRIC LAYER, may include depositing a dielectric layer 20 formed of lead-lanthanum-zirconium-titanate (PLZT) deposited on top of the first electrode 18 using a sol-gel process. Details of process parameters for this step are provided above.

Step 240, ANNEAL THE DIELECTRIC LAYER, may include annealing the dielectric layer onto the first electrode and the substrate at six-hundred-fifty degrees Celsius (650° C.). Details of process parameters for this step are provided above.

Step 250, DEPOSIT SECOND ELECTRODE, may include depositing a second electrode 24 on top of the substrate by electron-beam evaporation. Details of process parameters for this step are provided above.

Step 260, ROLL CAPACITOR INTO TUBE-SHAPE, may include rolling the capacitor 10 into a tube-shape, wherein the tube-shape has a radius of less than ten millimeters (10 mm).

Accordingly, a capacitor 10, and a method 200 of forming the capacitor 10 is provided. Preferably, the capacitor uses ultra-thin flexible glass (5-100 um thick) as the substrate 12 to make high voltage, high dielectric constant, thin-film PLZT capacitors. The substrate 12 is metalized at least on one side, coated with PLZT as the dielectric material and then metal is deposited on top of the PLZT as the top electrode. Ultra-thin flexible glass as a carrier substrate for the fabrication of high voltage, high dielectric constant, thin-film PLZT capacitors is advantageous over prior examples of PLZT capacitors on substrates of other than glass. The use of glass solves or avoids many of the capacitor processing and packaging issues that are created with their use. Metal foils generally have rough surfaces that require further processing to allow their use. However, dielectric thin-films and metal coated silicon wafers are generally brittle and expensive. Ultra-thin glass has been found to be relative smooth compared to metal foils, so eliminates the need for additional polishing, cleaning, and the de-burring processes that are required for metal. The ultra-thin glass is typically manufactured in a clean room environment, and it can be rolled onto a spool just like a metal foil so a spool of ultra-thin glass can be utilized in a roll-to-roll type of process for making the capacitors. This same flexibility property of the ultra-thin glass that facilitates the roll-to-roll processing also allows for the capacitor-on-glass to be packaged in a tubular form. Because the flexible ultra-thin glass in combination with a thin metallization applied to one side virtually mimics a metal film—all of the advantages of a metal film can be realized (i.e. flexible, electrically conductive, and thin) without additional processing steps (e.g. polishing) required by the metal film to meet the surface roughness specifications. Furthermore, the ultra-thin glass acts as a ready-made insulator layer if the capacitor built thereon is rolled into a tubular can-type package.

While this invention has been described in terms of the preferred embodiments thereof, it is not intended to be so limited, but rather only to the extent set forth in the claims that follow.

We claim:

1. A method of forming a capacitor, said method comprising:
    providing a substrate formed of glass;
    depositing a first electrode on top of the substrate by electron-beam evaporation;
    depositing a dielectric layer formed of lead-lanthanum-zirconium-titanate (PLZT) deposited on top of the first electrode using a sol-gel process; and
    depositing a second electrode on top of the dielectric layer by electron-beam evaporation.

2. The method in accordance with claim 1, wherein depositing the dielectric layer includes annealing the dielectric layer onto the first electrode and the substrate at six-hundred-fifty degrees Celsius (650° C.).

3. The method in accordance with claim 1, wherein the method includes rolling the capacitor into a tube-shape, wherein the tube-shape has a radius of less than ten millimeters (10 mm).

* * * * *